United States Patent
Zhang et al.

(10) Patent No.: US 12,525,471 B2
(45) Date of Patent: Jan. 13, 2026

(54) TAPE-GUIDED PIN INSERTION FEEDING MECHANISMS

(71) Applicants: CHANGZHOU UNIVERSITY, Jiangsu (CN); CHANGZHOU KERUIER TECHNOLOGY CO., LTD., Jiangsu (CN)

(72) Inventors: Yi Zhang, Changzhou (CN); Qingqing Xu, Changzhou (CN); Ang Li, Changzhou (CN); Guangming Tang, Changzhou (CN); Chunxing Xu, Changzhou (CN); Meng Yan, Changzhou (CN)

(73) Assignees: CHANGZHOU UNIVERSITY, Changzhou (CN); CHANGZHOU KERUIER TECHNOLOGY CO., LTD., Changzhou (CN)

( * ) Notice: Subject to any disclaimer, the term of this patent is extended or adjusted under 35 U.S.C. 154(b) by 0 days.

(21) Appl. No.: 19/220,077

(22) Filed: May 27, 2025

(65) Prior Publication Data
US 2025/0285889 A1    Sep. 11, 2025

Related U.S. Application Data

(63) Continuation-in-part of application No. PCT/CN2023/136389, filed on Dec. 5, 2023.

(30) Foreign Application Priority Data

Aug. 2, 2023  (CN) .......................... 202310963003.4

(51) Int. Cl.
*H01L 21/67*  (2006.01)
*B23P 19/00*  (2006.01)
(Continued)

(52) U.S. Cl.
CPC ...... *H01L 21/67092* (2013.01); *B23P 19/001* (2013.01); *H01L 21/67742* (2013.01); *H01L 21/6776* (2013.01); *H01L 21/68* (2013.01)

(58) Field of Classification Search
CPC ............. B23P 19/001; H01L 21/67092; H01L 21/67742; H01L 21/6776; H01L 21/68
See application file for complete search history.

(56) References Cited

U.S. PATENT DOCUMENTS

| | | | |
|---|---|---|---|
| 4,816,420 A * | 3/1989 | Bozler | C30B 33/00 257/E25.007 |
| 8,011,557 B1 * | 9/2011 | Zhang | B23K 3/063 228/43 |
| 2025/0285889 A1 * | 9/2025 | Zhang | H01L 21/68 |

FOREIGN PATENT DOCUMENTS

| | | |
|---|---|---|
| CN | 104476360 A | 4/2015 |
| CN | 104902738 A | 9/2015 |

(Continued)

OTHER PUBLICATIONS

International Search Report in PCT/CN2023/136389 mailed on Mar. 3, 2024, 5 pages.
(Continued)

*Primary Examiner* — Minh N Trinh

(57) ABSTRACT

The present disclosure relates to a tape-guided pin insertion feeding mechanism. The mechanism includes: a pin tape material tray configured to store a pin tape; a feeding mechanism configured to drive the pin tape to move horizontally towards a cutting mechanism to feed material; and a pickup mechanism rotatably disposed on one side of the cutting mechanism. The cutting mechanism is configured to cut a single insertion pin from the pin tape.

3 Claims, 10 Drawing Sheets

(51) Int. Cl.
*H01L 21/677* (2006.01)
*H01L 21/68* (2006.01)

(56) References Cited

FOREIGN PATENT DOCUMENTS

| | | |
|---|---|---|
| CN | 104917033 A | 9/2015 |
| CN | 107370005 A | 11/2017 |
| CN | 108418079 A | 8/2018 |
| CN | 110459490 A | 11/2019 |
| CN | 211150526 U | 7/2020 |
| CN | 111628388 A | 9/2020 |
| CN | 111863663 A | 10/2020 |
| CN | 112276196 A | 1/2021 |
| CN | 112548524 A | 3/2021 |
| CN | 213602161 U | 7/2021 |
| CN | 113471792 A | 10/2021 |
| CN | 113794083 A | 12/2021 |
| CN | 215315376 U | 12/2021 |
| CN | 114188251 A | 3/2022 |
| CN | 116705682 A | 9/2023 |

OTHER PUBLICATIONS

Written Opinion in PCT/CN2023/136389 mailed on Mar. 3, 2024, 6 pages.
Notification to Grant Patent Right for Invention in Chinese Application No. 202310963003.4 mailed on Sep. 12, 2023, 6 pages.

* cited by examiner

TAPE-GUIDED PIN INSERTION FEEDING MECHANISMS

CROSS-REFERENCE TO RELATED APPLICATIONS

This application is a continuation-in-part of international application No. PCT/CN2023/136389, filed on Dec. 5, 2023, which claims the priority to Chinese application No. 202310963003.4, filed on Aug. 2, 2023, the entire contents of each of which are incorporated herein by reference.

TECHNICAL FIELD

The present disclosure relates to the field of conveyor loading technology, and in particular relates to a tape-guided pin insertion feeding mechanism.

BACKGROUND

IGBT (insulated gate bipolar transistor) terminal soldering is one of the key processes in IGBT packaging, and an insertion pin of the IGBT terminal needs to be precisely positioned in a soldering position before soldering. In order to improve the scale of production capacity of modules and to reduce the contamination caused by human contact with the product, the mass production of the tape-type insertion pin has become the main form of supply of terminal insertion pin. At present, there are problems in the feeding technology of the insertion pin, such as easy damage to the surface of the insertion pin during insertion pin feeding, burrs during insertion pin cutting, and uneven incisions, and low efficiency. Therefore, it is desirable to provide a tape-guided pin insertion feeding mechanism.

SUMMARY

One or more embodiments of the present disclosure provide a tape-guided pin insertion feeding mechanism, comprising:

a pin tape material tray, a feeding mechanism, a pickup mechanism, and a cutting mechanism, wherein the pin tape material tray is rotatably disposed on one side of the feeding mechanism, the pin tape material tray is configured to store a pin tape;

the feeding mechanism is fixed to one side of the cutting mechanism, wherein the feeding mechanism is configured to drive the pin tape to move horizontally towards the cutting mechanism to feed material;

the pickup mechanism is rotatably disposed on one side of the cutting mechanism;

the cutting mechanism is configured to cut a single insertion pin from the pin tape, wherein after the feeding mechanism drives the pin tape to move to a cutting station of the cutting mechanism, a movable end of the cutting mechanism moves horizontally toward the pin tape to disengage the insertion pin from the pin tape;

the insertion pin continues to move within the movable end of the cutting mechanism, the movable end of the cutting mechanism being configured to sand an outer wall of the insertion pin and be capable of spraying flux to a side wall of the insertion pin;

a movable end of the pickup mechanism moves downwardly to pick up the insertion pin disposed within the movable end of the cutting mechanism.

In some embodiments, the feeding mechanism includes a fixed base plate, a pin tape guide plate, a horizontal prismatic joint, two sensors, and a plurality of guide wheels, wherein the fixed base plate is horizontally disposed, the pin tape guide plate is vertically fixed to the fixed base plate, and a side wall of the pin tape guide plate is provided with a guide groove for horizontal movement of the pin tape;

the horizontal prismatic joint is fixed to the fixed base plate and a movable end of the horizontal prismatic joint is capable of being moved horizontally with respect to the pin tape guide plate;

the plurality of guide wheels are rotatably disposed on the fixed base plate, and the pin tape is configured to be inserted into the guide groove after passing from the pin tape material tray through the plurality of guide wheels;

the two sensors are respectively fixed on both sides of the pin tape guide plate, wherein the movable end of the horizontal prismatic joint is configured to drive the pin tape to move horizontally in a direction toward the cutting mechanism.

In some embodiments, the horizontal prismatic joint includes a feeding cylinder, a horizontal slide plate, a fixed cylinder, and two positioning pins, wherein the feeding cylinder is fixed to the fixed base plate, and the feeding cylinder is parallel to the pin tape guide plate;

the horizontal slide plate is fixed to a movable end of the feeding cylinder;

the fixed cylinder is fixed to the horizontal slide plate, the fixed cylinder and the pin tape guide plate are perpendicular to each other;

Two of the locating pins are symmetrically secured to the movable the two positioning pins are symmetrically fixed to a movable end of the fixed cylinder and the two positioning pins are configured to be inserted into positioning holes of the pin tape.

In some embodiments, the cutting mechanism includes a positioning frame, a cutting cylinder, a cutting assembly, a positioning cylinder, a positioning block, and a pin tape moving cylinder, wherein the positioning frame is fixed to one side of the fixed base plate, the cutting cylinder is fixed to the positioning frame, the cutting assembly is fixed to a movable end of the cutting cylinder, and a moving direction of the cutting assembly and the pin tape are perpendicular to each other;

the positioning cylinder is fixed to the positioning frame and the positioning cylinder is provided opposite to the cutting cylinder;

the positioning block is fixed to a movable end of the positioning cylinder and the positioning block is configured to abut against the side wall of the insertion pin;

the pin tape moving cylinder is fixed to one side of the cutting cylinder, the pin tape moving cylinder is configured to drive the pin tape to move horizontally; wherein the pin tape moving cylinder drives the pin tape to move horizontally until the insertion pin is located in the cutting station, and the positioning block moves to abut against the side wall of the insertion pin;

the cutting assembly moves horizontally toward the insertion pin to cut the insertion pin off from the pin tape;

during horizontal movement of the insertion pin along an inner wall of the cutting assembly, the cutting assembly is capable of sanding the side wall of the insertion pin and spraying the flux against the side wall of the insertion pin.

In some embodiments, the cutting assembly includes a pushing block, two cutters, two sanding components, and a limiting component, wherein the pushing block is fixed to the movable end of the cutting cylinder;

the two cutters are symmetrically fixed to an end of the pushing block, and a distance between the two cutters is not less than a width of the insertion pin;

one end of the sanding component is fixed to an inner wall of the cutter, and the two sanding components are configured to sand walls of the insertion pin on both sides;

the limiting component is slidably disposed between the two cutters, wherein after the insertion pin is moved to the cutting station, the positioning block moves toward the insertion pin to abut against the insertion pin;

the pushing block drives the cutter to move toward the pin tape to bring the limiting component against the other side of the insertion pin;

the cutter continues to move toward the insertion pin to cut connecting tapes on both sides of the insertion pin; and the insertion pin moves horizontally toward the sanding component, wherein the sanding component is configured to sand burrs on the side wall of the insertion pin.

In some embodiments, the sanding component is in a form of a circular arc, and a sliding column is provided between the other end of the sanding component and the inner wall of the cutter, wherein the pushing block continues to move toward the positioning block and the insertion pin is configured to squeeze the sanding component to deform the other end of the sanding component toward a side wall of the cutter;

the sliding column is configured to retract into the side wall of the cutter, to cause a reservoir capsule within the pushing block to eject the flux toward a side wall of the limiting component.

In some embodiments, the limiting component includes a limiting block, a compression spring, and a positioning plate, wherein a side wall of the pushing block is provided with a receiving groove, the limiting block is configured to contract into the receiving groove;

one end of the compression spring is fixed to aside wall of the receiving groove, and the other end of the compression spring is fixed to a side wall of the positioning plate;

the limiting block is vertically adjustably provided on an outer wall of the positioning plate, the limiting block is configured to engage the insertion pin.

In some embodiments, the limiting block is in a shape of a "T," and a width of a vertical segment of the limiting block is less than a distance between the two sanding components;

a lower end of a horizontal segment of the limiting block abuts against a bottom wall of a collection plate between the two cutters;

In some embodiments, a sponge block is fixed on an inner wall of the receiving groove, the sponge block is connected to the reservoir capsule, the positioning plate is provided with a plurality of through-holes, each through-hole being slidably provided with a spring tube, one end of the spring tube being slidably provided on a side wall of the limiting block, wherein when the limiting block is retracted into the receiving groove, the flux on the sponge block is configured to spray towards the side wall of the insertion pin through the spring tube;

when the pickup mechanism clamps the insertion pin, the insertion pin is configured to drive the limiting block synchronously upwardly during upward movement to enable the limiting block to vibrate with respect to the positioning plate.

In some embodiments, the pickup mechanism includes a rotating motor, a gripper turntable, a plurality of pickup pin grippers, and a vertical module, wherein the gripper turntable is fixed to a movable end of the rotating motor, and the rotating motor is fixed to a side of the positioning frame;

the plurality of pickup pin grippers are circumferentially disposed around the gripper turntable, the plurality of pickup pin grippers are configured to pick up the insertion pin;

the vertical module is fixed above the cutting assembly, the vertical module is configured to drive the plurality of pickup pin grippers to move downwardly; wherein when the plurality of pickup pin grippers are circumferentially rotated below the vertical module, a movable end of the vertical module moves downward to propel the plurality of pickup pin grippers toward the insertion pin to pick up the insertion pin.

In some embodiments, the plurality of pickup pin grippers include a pin pickup frame, a gripper riser, a gripper cylinder, gripper fingers, and a reset spring, wherein the pin pickup frame is fixed to the gripper turntable;

the gripper riser is vertically adjustably provided on a side wall of the pin pickup frame, the gripper cylinder is fixed at a lower end of the gripper riser, and two of the gripper fingers are symmetrically fixed at a movable end of the gripper cylinder; and one end of the reset spring is fixed on the pin pickup frame, and the other end of the reset spring is fixed on the gripper riser.

One or more embodiments of the present disclosure further provide an operating method of a tape-guided pin insertion feeding mechanism, wherein a pin tape is wound on a pin tape material tray, the pin tape passes through a plurality of guide wheels, a pin tape guide plate in turn and then extends toward a cutting mechanism, a movable end of a horizontal prismatic joint moves horizontally to drive the pin tape to move uniformly towards a cutting station;

after an insertion pin is moved to the cutting station, a positioning cylinder is configured to drive a positioning block to move toward the insertion pin until the positioning block abuts against one side wall of the insertion pin, and the cutting cylinder is configured to drive a cutting assembly to move toward the other side of the insertion pin; a limiting component first abuts against the other side wall of the insertion pin, and during a process of the cutter continuing to move toward the insertion pin, the cutter is able to cut off connecting tapes on both sides of the insertion pin;

as the cutting assembly continues to move in a direction towards the positioning block, the insertion pin is capable of moving inwardly along an inner wall of both of the two cutters to bring the side walls of the insertion pin against a sanding component, and the insertion pin is configured to push against the sanding component deformation, the sanding component is configured to sand the burrs on the side walls of the insertion pin;

to the extent that the insertion pin abuts against a side wall of the pushing block, the limiting component is capable of spraying a flux against the insertion pin.

BRIEF DESCRIPTION OF THE DRAWINGS

The present disclosure will be further illustrated by way of exemplary embodiments, which will be described in detail by means of the accompanying drawings. These embodiments are not limiting, and in these embodiments, the same numbering denotes the same structure, wherein.

Figure 1:
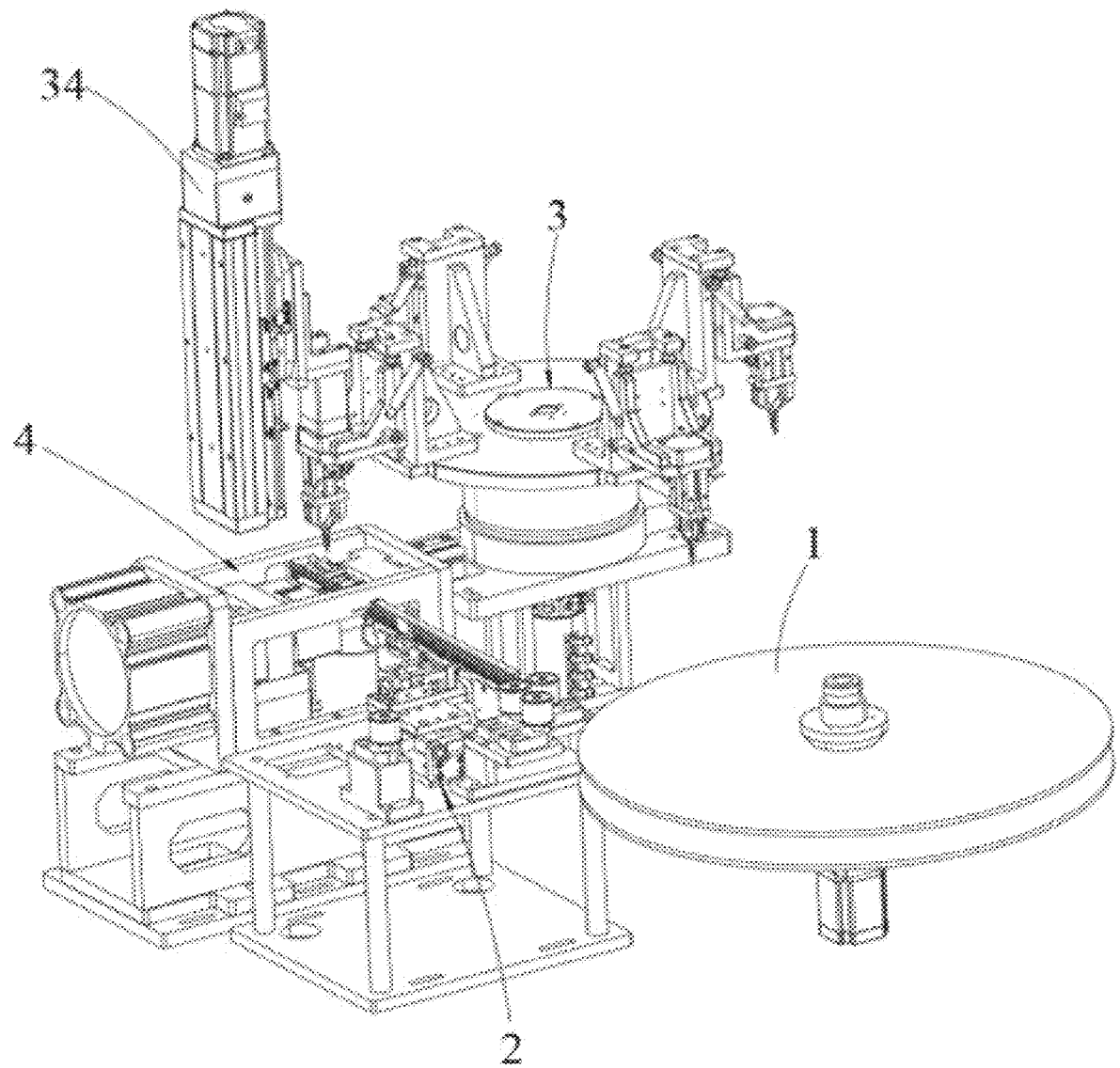
FIG. 1 is a three-dimensional view of a tape-guided pin insertion feeding mechanism according to some embodiments of the present disclosure.

Markings in the figures denote: 1, pin tape material tray; 2, feeding mechanism; 21, fixed base plate; 22, pin tape guide plate; 23, horizontal prismatic joint; 231, feeding cylinder; 232, horizontal slide plate; 233, fixed cylinder; 234, positioning pin; 24, sensor; 25, guide wheel; 26, guide groove; 3, pickup mechanism; 31, rotating motor; 32, gripper turntable; 33, pickup pin gripper; 331, pin pickup frame; 332, gripper riser; 333, gripper cylinder; 334, gripper finger; 335, reset spring; 34, vertical module; 341, servo motor; 342, linear module; 343, pressing block; 4, cutting mechanism; 41, positioning frame; 42, cutting cylinder; 43, positioning cylinder; 44, positioning block; 45, pin tape moving cylinder; 46, cutting assembly; 461, pushing block; 462, cutter; 463, sanding component; 464, limiting component; 465, sliding column; 466, limiting block; 467, positioning plate; 468, receiving groove; 469, spring tube; 470, reservoir capsule; 47, collection plate; 5, positioning hole.

DETAILED DESCRIPTION

In order to more clearly illustrate the technical solutions of the embodiments of the present disclosure, the accompanying drawings needed to be utilized in the description of the embodiments are briefly described below. Obviously, the accompanying drawings in the following description are only some examples or embodiments of the present disclosure, and it is possible for a person of ordinary skill in the art to apply the present disclosure to other similar scenarios according to these drawings without creative labor. The present disclosure can be applied to other similar scenarios based on these drawings. Unless obviously obtained from the context or the context illustrates otherwise, the same numeral in the drawings refers to the same structure or operation.

It should be understood that as used herein, the terms "system," "device," "unit," and/or "module" as used herein are a way to distinguish between different components, elements, parts, sections, or assemblies at different levels. However, the words may be replaced by other expressions if other words accomplish the same purpose.

As shown in the specification and the claims, unless the context clearly suggests an exception, the words "one," "a," "an," and/or "the" do not refer specifically to the singular, but may also include the plural. In general, the terms "including" and "comprising" only suggest the inclusion of explicitly identified steps and elements that do not constitute an exclusive list, and the method or apparatus may also include other steps or elements.

Figure 2:
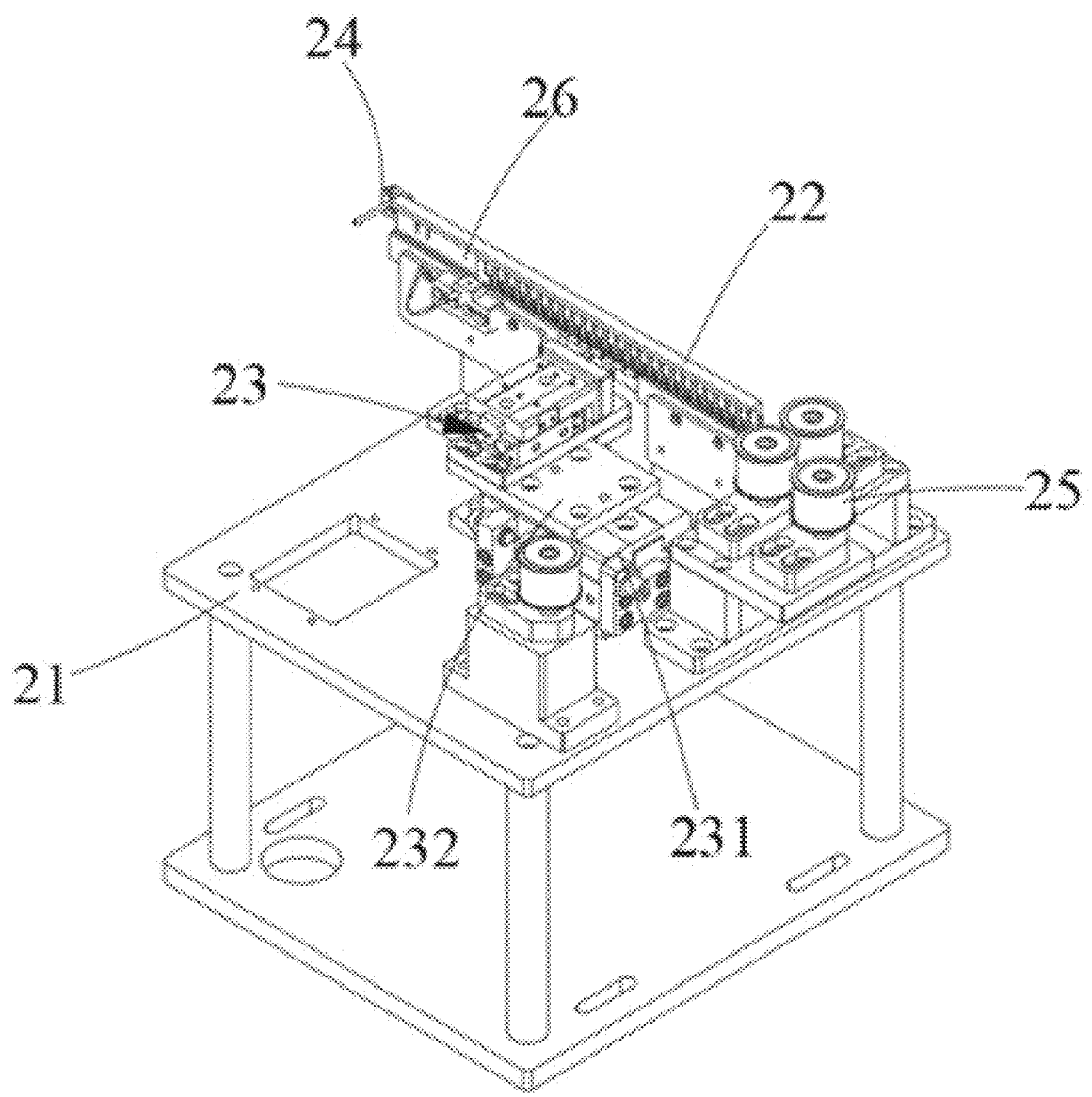
FIG. 2 is a three-dimensional view of a feeding mechanism according to some embodiments of the present disclosure.
Figure 3:
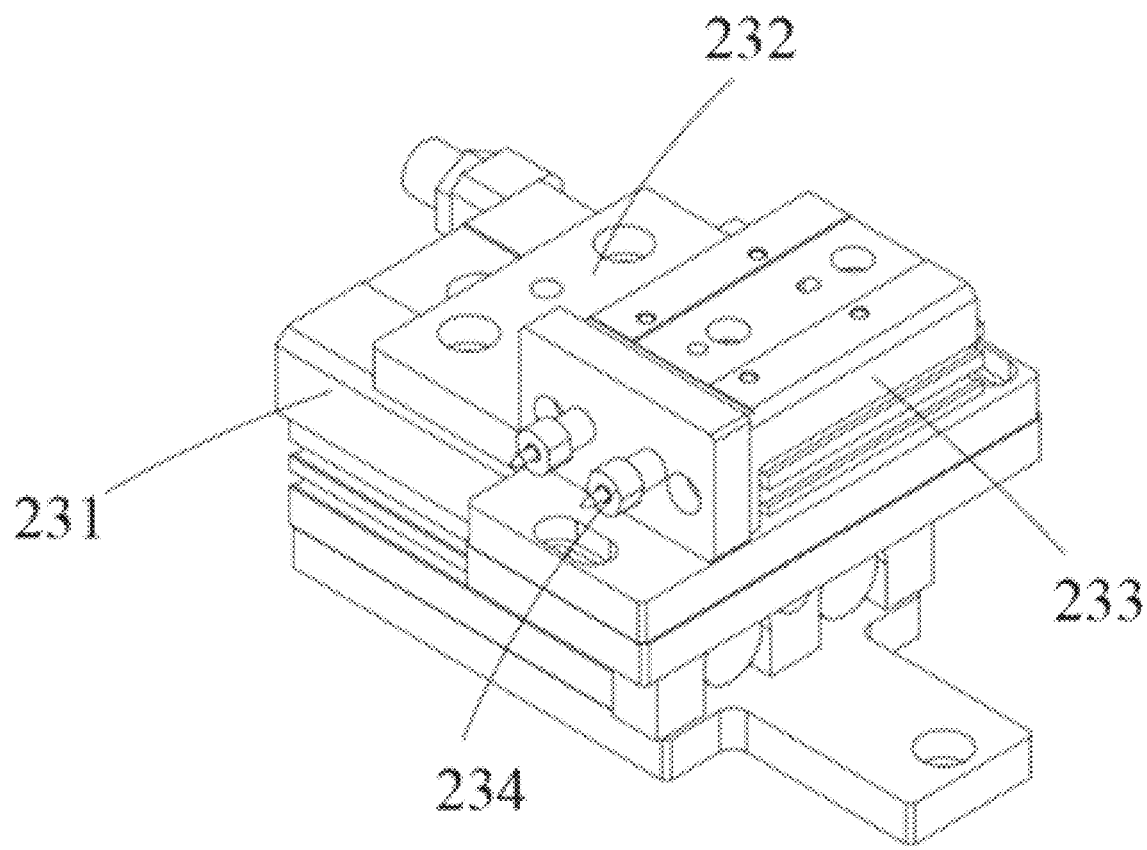
FIG. 3 is a three-dimensional view of a horizontal prismatic joint according to some embodiments of the present disclosure.
Figure 4:
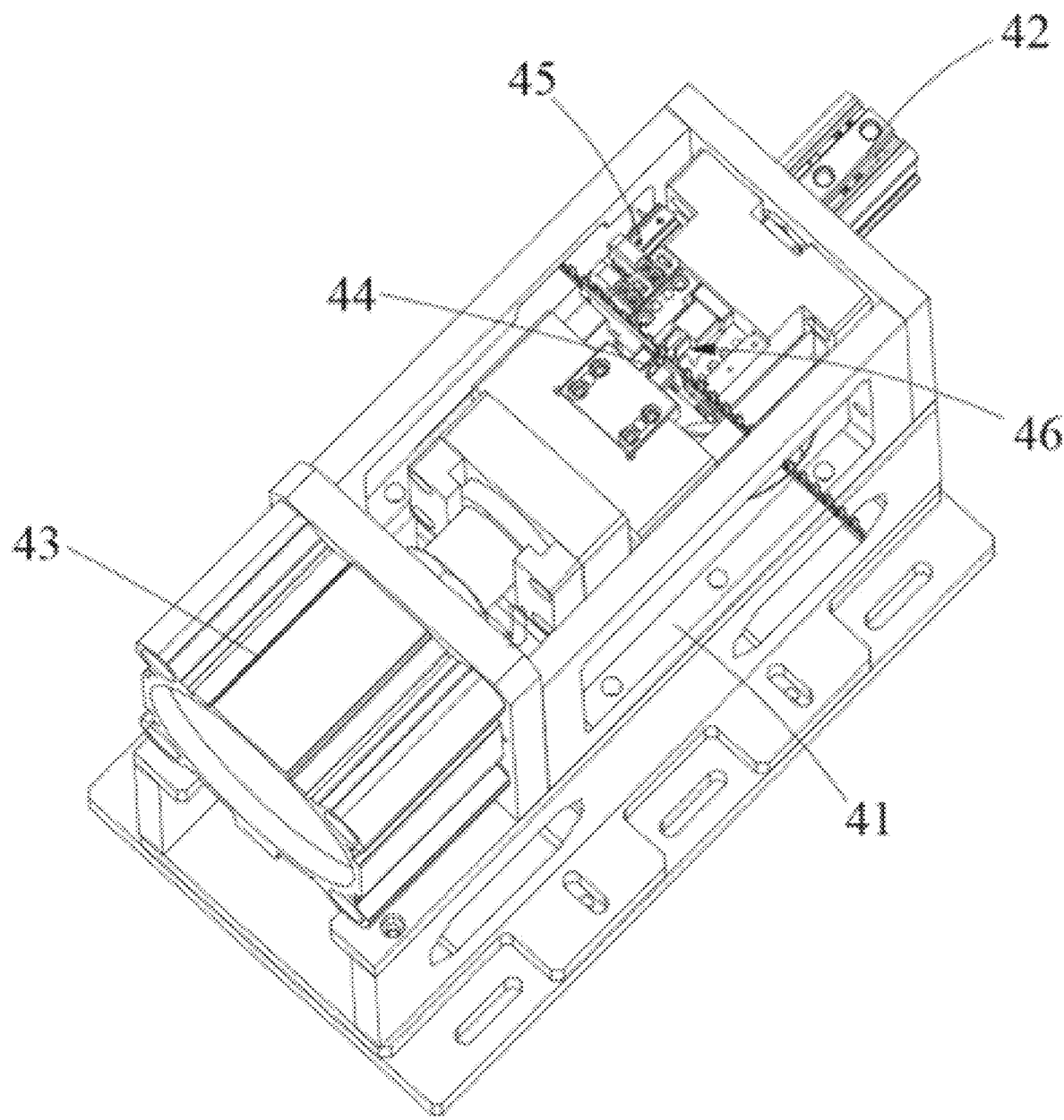
FIG. 4 is a three-dimensional view of a cutting mechanism according to some embodiments of the present disclosure.
Figure 5:
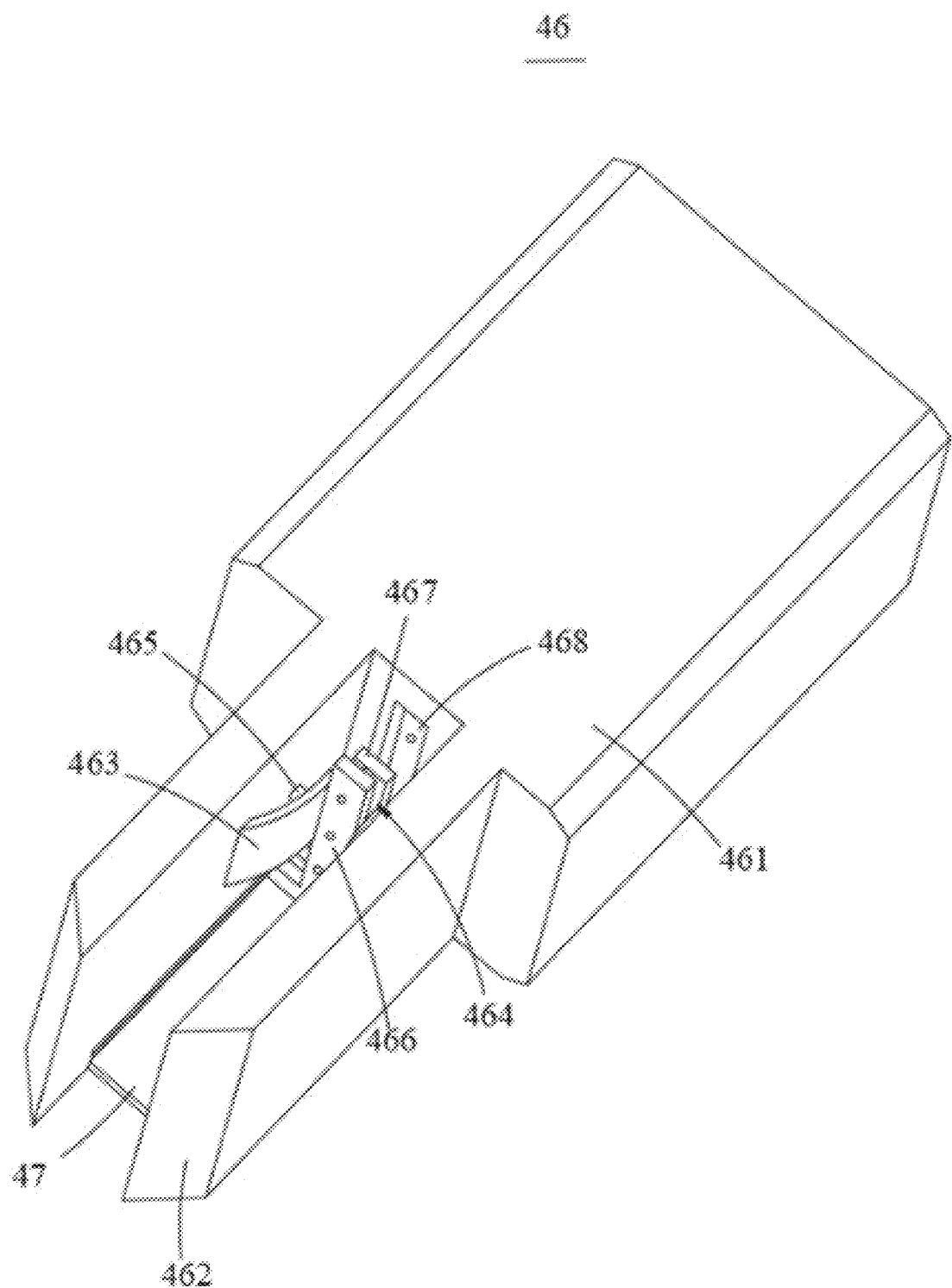
FIG. 5 is a three-dimensional view of a cutting assembly according to some embodiments of the present disclosure.
Figure 6:
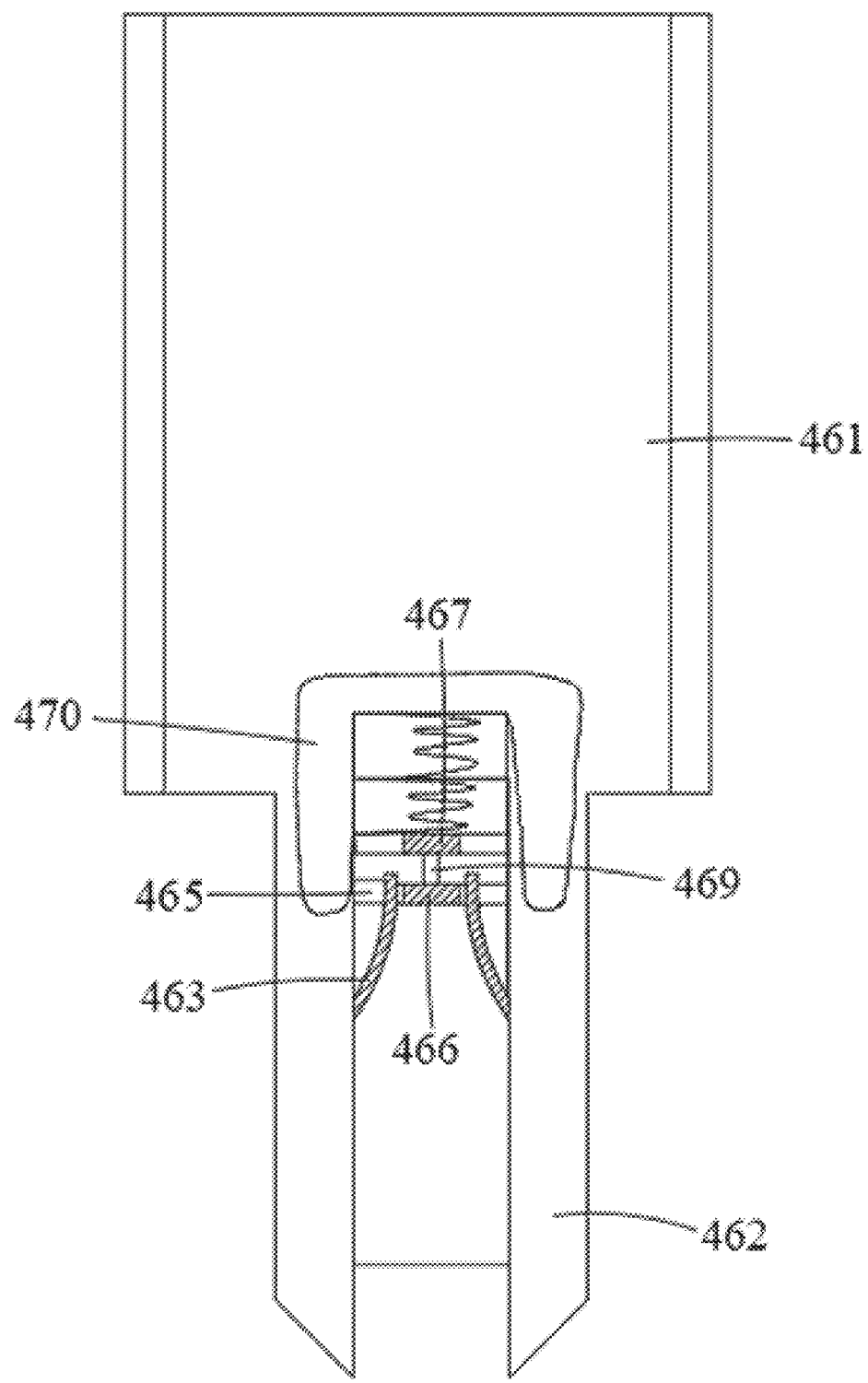
FIG. 6 is a top view of a cutting assembly according to some embodiments of the present disclosure.
Figure 7:
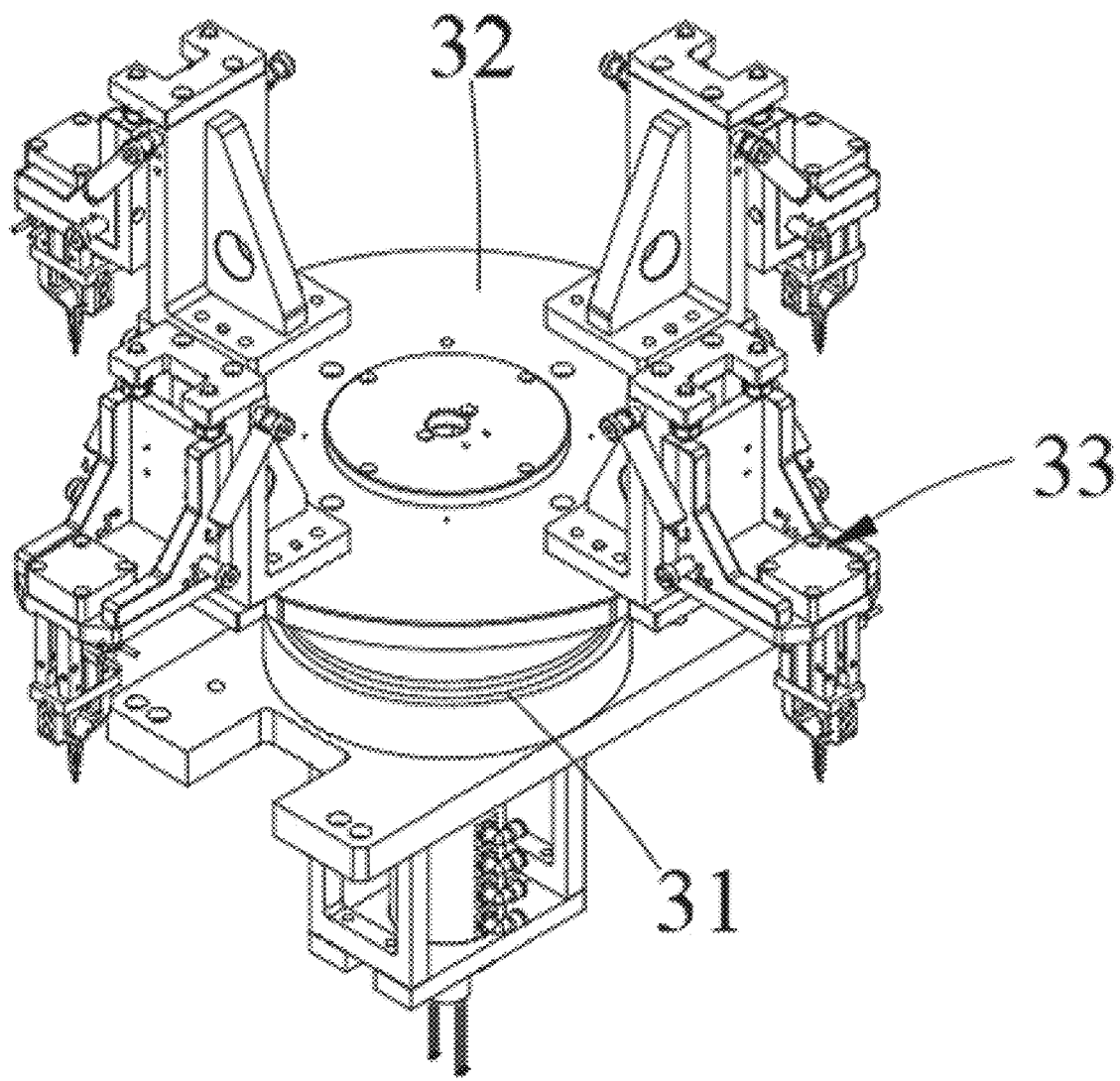
FIG. 7 is a three-dimensional view of a pickup mechanism according to some embodiments of the present disclosure.
Figure 8:
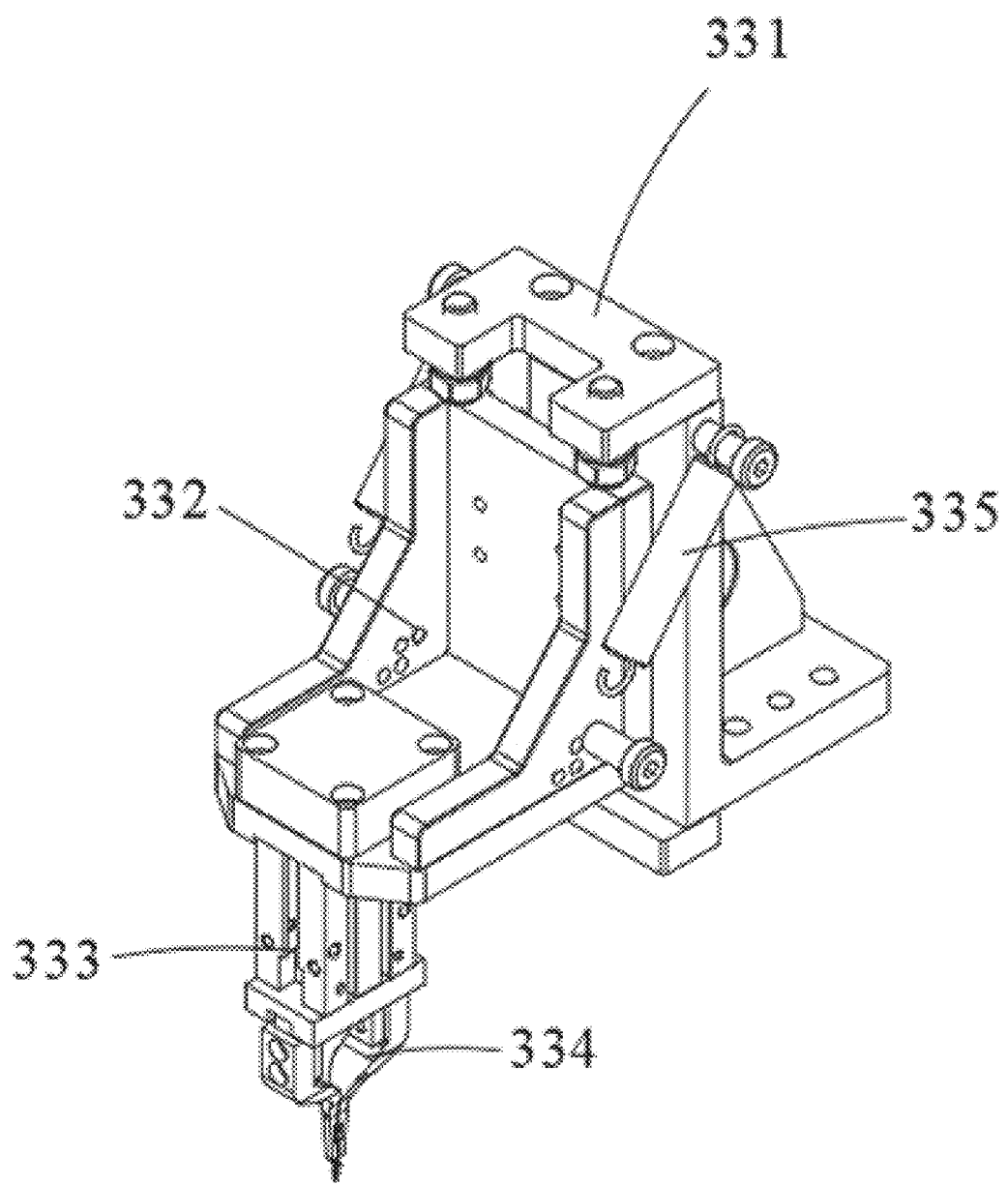
FIG. 8 is a three-dimensional view of a pickup pin gripper according to some embodiments of the present disclosure.
Figure 9:
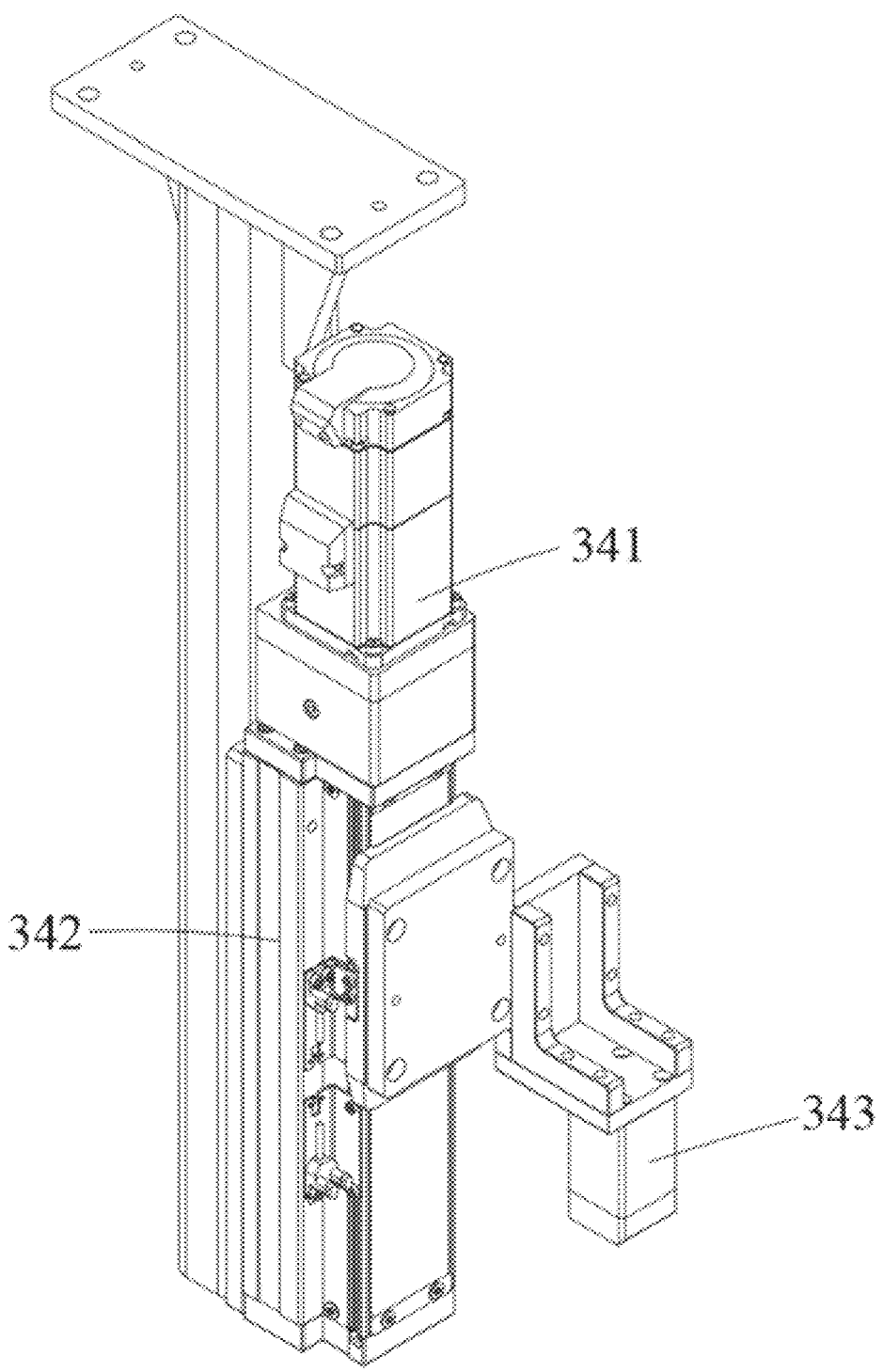
FIG. 9 is a three-dimensional view of a vertical module according to some embodiments of the present disclosure.
Figure 10:
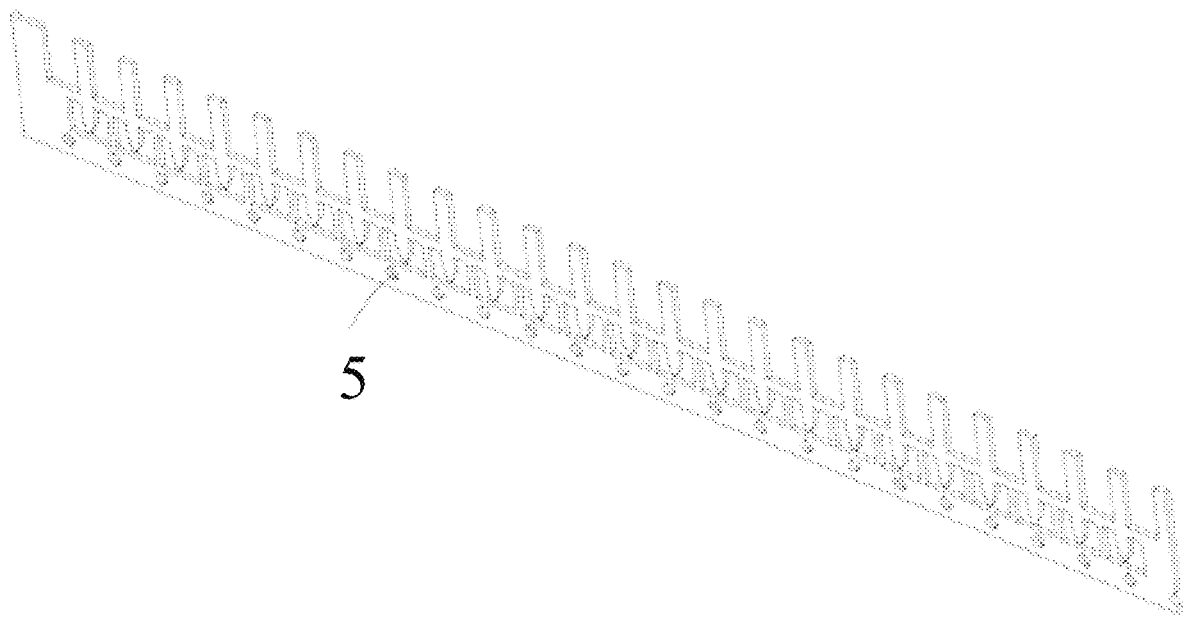
FIG. 10 is a three-dimensional view of a pin tape according to some embodiments of the present disclosure.

FIG. 1 is a three-dimensional view of a tape-guided pin insertion feeding mechanism according to some embodiments of the present disclosure. FIG. 2 is a three-dimensional view of a feeding mechanism according to some embodiments of the present disclosure. FIG. 3 is a three-dimensional view of a horizontal prismatic joint according to some embodiments of the present disclosure. FIG. 4 is a three-dimensional view of a cutting mechanism according to some embodiments of the present disclosure. FIG. 5 is a three-dimensional view of a cutting assembly according to some embodiments of the present disclosure. FIG. 6 is a top view of a cutting assembly according to some embodiments of the present disclosure. FIG. 7 is a three-dimensional view of a pickup mechanism according to some embodiments of the present disclosure. FIG. 8 is a three-dimensional view of a pickup pin gripper according to some embodiments of the present disclosure. FIG. 9 is a three-dimensional view of a vertical module according to some embodiments of the present disclosure. FIG. 10 is a three-dimensional view of a pin tape according to some embodiments of the present disclosure.

As shown in FIG. 1 to FIG. 10, some embodiments of the present disclosure provide a tape-guided pin insertion feeding mechanism, comprising a pin tape material tray 1, a feeding mechanism 2, a pickup mechanism 3, and a cutting mechanism 4. The pin tape material tray 1 is rotatably disposed on one side of the feeding mechanism 2, and the pin tape material tray 1 is configured to store a pin tape. The pin tape is wound on the pin tape material tray 1, and a movable end of the pin tape material tray 1 is rotated circumferentially for unwinding the pin tape and discharging. The feeding mechanism 2 is fixed to one side of the cutting mechanism 4, and the feeding mechanism 2 is configured to drive the pin tape to move horizontally towards the cutting mechanism 4 to feed material. The horizontal prismatic joint 23 can cooperate with positioning holes 5 on the pin tape, and by inserting positioning pins 234 into the positioning holes 5, a feeding cylinder 231 drives the positioning pins 234 to move horizontally, to drive the pin tape to move horizontally synchronously. The pickup mechanism 3 is rotatably disposed on one side of the cutting mechanism 4. Gripper fingers 334 is configured to clamp a single insertion pin that is cut down, and the cutting mechanism 4 is configured to cut the single insertion pin from the pin tape. After the feeding mechanism 2 drives the pin tape to move to a cutting station of the cutting mechanism 4, a movable end of the cutting mechanism 4 moves horizontally toward the pin tape to disengage the insertion pin from the pin tape. The insertion pin continues to move within the movable end of the cutting mechanism 4, and the movable end of the cutting mechanism 4 is configured to sand an outer wall of the insertion pin and is capable of spraying flux to the outer wall of the insertion pin. A movable end of the pickup mechanism 3 moves downward to pick up the insertion pin disposed within the movable end of the cutting mechanism 4.

By the setting of the feeding mechanism 2, the horizontal prismatic joint 23 can cooperate with the positioning holes 5 on the pin tape, which avoids directly contacting with the insertion pin, and ensures that there is no damage to the insertion pin during the feeding process. By the setting of the cutting assembly 46, two cutters 462 are able to cut off connecting tapes on both sides of the insertion pin at the same time, and at the same time, a sanding component 463 is able to sand burrs on both sides of the insertion pin when the insertion pin moves between the two cutters 462. In a process of contacting the insertion pin with a pushing block 461, a limiting component 464 is able to spray the flux to the side wall of the insertion pin, which avoids the occurrence of untidy breaks and the burrs, and improves working efficiency.

For more detailed description of the horizontal prismatic joint 23, see the relevant description in FIG. 2. For more description of the feeding cylinder 231, the positioning pin 234, and the positioning hole 5, see the relevant description in FIG. 3. For more description of the cutting assembly 46, the pushing block 461, the cutter 462, and the sanding component 463, see the relevant descriptions in FIG. 4 to FIG. 5.

In order to avoid that a surface of the insertion pin is abraded when feeding the insertion pin, in some embodiments, as shown in FIG. 2-FIG. 3, the feeding mechanism 2 includes a fixed base plate 21, a pin tape guide plate 22, a horizontal prismatic joint 23, two sensors 24, and a plurality of guide wheels 25. The fixed base plate 21 is horizontally disposed. The pin tape guide plate 22 is vertically fixed to the fixed base plate 21, and a side wall of the pin tape guide plate 22 is provided with a guide groove 26 for horizontal movement of the pin tape. The pin tape slides horizontally along the guide groove 26. The horizontal prismatic joint 23 is fixed to the fixed base plate 21 and a movable end of the horizontal prismatic joint 23 is capable of moving horizontally with respect to the pin tape guide plate 22. The plurality of guide wheels 25 are rotatably disposed on the fixed base plate 21, and the pin tape is configured to be inserted into the guide groove 26 after passing from the pin tape material tray 1 through the plurality of guide wheels 25. The two sensors 24 are respectively fixed on both sides of the pin tape guide plate 22, wherein the movable end of the horizontal prismatic joint 23 is configured to drive the pin tape to move horizontally in a direction toward the cutting mechanism 4.

The movable end of the horizontal prismatic joint 23 is adapted to the positioning holes 5 on the pin tape. The positioning pins 234 are able to be inserted into the positioning holes 5. The feeding cylinder 231 is configured to drive the positioning pins 234 to move horizontally to drive the pin tape to synchronously move the pin tape horizontally by one pin position. The two sensors 24 are configured to detect whether a horizontal movement of the pin tape is within an acceptable limit.

In some embodiments, the two sensors 24 may include at least one of a photoelectric sensor, a visual sensor, or the like. For example, the visual sensor may capture an image of the pin tape via a camera and analyze a positional deviation to determine whether the horizontal movement of the pin tape is within the acceptable limit.

In some embodiments, the feeding mechanism 2 includes a plurality of pin tape guide plates 22, and the pickup mechanism 3 includes a plurality of pickup pin grippers 33.

In some embodiments, a plurality of pin tape guide plates 22 and a plurality of guide grooves 26 may be vertically disposed above the fixed base plate 21 by means of threaded connections, welding, or the like, and one pin tape guide plate 22 and a corresponding guide groove 26 may accommodate a single pin tape. One guide groove 26 is equipped with an independent horizontal prismatic joint 23 to drive the corresponding pin tape to move toward the cutting mechanism 4.

In some embodiments, a gripper turntable 32 is provided above a positioning frame 41. The gripper turntable 32 is driven by a rotating motor 31 and achieves rotational positioning. The gripper turntable 32 has a plurality of pickup pin grippers 33 arranged uniformly in a circumferential direction. One pickup pin gripper 33 corresponds to a pickup position of one pin tape. A vertical module 34 is fixed above the gripper turntable 32, and the vertical module 34 is configured to drive the plurality of pickup pin grippers 33 to move downwardly to pick up insertion pins that are cut down. For more detailed descriptions of the gripper turntable 32, the pickup pin gripper 33, and the vertical module 34, see the related description in FIG. 7.

In some embodiments of the present disclosure, by setting a plurality of pin tape guide plates and a plurality of pickup pin grippers, it is possible to realize simultaneous feeding of a plurality of pin tapes and parallel pickup of a plurality of insertion pins, thereby improving the feeding efficiency.

In some embodiments, an outer wall of the guide wheel 25 and an inner wall of the guide groove 26 are provided with flexible liners (not shown in the figures). The flexible liner refers to a protective layer made of a material having flexible and deformable properties. For example, the flexible liner may be made of at least one of rubber, polyurethane, or the like. In some embodiments, the flexible liner may be secured to the outer wall of the guide wheel 25 and the inner wall of the guide groove 26 by means of bonding, or the like.

It should be appreciated that by providing the flexible liner, the friction of the pin tape during movement can be reduced, and surface wear can be minimized. At the same time, the flexible liner can absorb localized shocks and avoid misalignment or damage to the pin tape caused by violent vibration during the feeding process.

In some embodiments, as shown in FIG. 2-FIG. 3, the horizontal prismatic joint 23 includes the feeding cylinder 231, a horizontal slide plate 232, a fixed cylinder 233, and two positioning pins 234. The feeding cylinder 231 is fixed to the fixed base plate 21, and the feeding cylinder 231 is parallel to the pin tape guide plate 22. The horizontal slide plate 232 is fixed to a movable end of the feeding cylinder 231. The feeding cylinder 231 is configured to drive the horizontal slide plate 232 along a length direction of the pin tape guide plate 22 to enable the two positioning pins 234 to synchronously drive the pin tape to move horizontally. The fixed cylinder 233 is fixed to the horizontal slide plate 232. The fixed cylinder 233 and the pin tape guide plate 22 are perpendicular to each other. The two positioning pins 234 are symmetrically fixed to a movable end of the fixed cylinder 233, and the two positioning pins 234 are configured to be inserted into the positioning holes 5 of the pin tape.

When driving the pin tape to move horizontally, the fixed cylinder 233 drives the two positioning pins 234 to move toward the pin tape, causing one of the two positioning pins 234 to be inserted into the corresponding positioning hole 5. At this time, the feeding cylinder 231 drives the two positioning pins 234 to move horizontally in a direction toward the sensor 24, and the sensor 24 is able to detect whether the displacement of the pin tape is within the acceptable limit. After the movement of the pin tape is completed, the two positioning pins 234 are reset and slid in a direction away from the pin tape, and, at the same time, the feeding cylinder 231 is reset and moved in preparation for the next feeding action.

In some embodiments, the feeding mechanism 2 further includes a sensor (not shown in the figure) and a processor (not shown in the figure). The sensor is configured to acquire sensing data in real time, and the processor is configured to adjust a feeding speed based on the sensing data.

The sensor refers to a device that converts a mechanical signal into an electrical signal during the operation of the tape-guided pin insertion feeding mechanism. In some embodiments, the sensor may include at least one of a position sensor, a tension sensor, a speed sensor, or the like. The sensor may be mounted on the pin tape guide plate 22 and/or the guide groove 26 for real-time collection of the sensing data.

The sensing data refers to data collected by the sensor. For example, the sensing data may include a pin tape position, a pin tape speed, and a pin tape tension.

The processor refers to a component that handles all kinds of data and instructions during the operation of the tape-guided pin insertion feeding mechanism. For example, the processor may include at least one of a CPU, a microcontroller, an MCU, or the like. In some embodiments, the processor may be communicatively coupled to the sensor to obtain the sensing data. The processor may also adjust the feeding speed based on the sensing data. In this case, the feeding speed refers to a transfer speed of the pin tape.

In some embodiments of the present disclosure, by setting up a sensor and a processor, sensing data (such as the pin tape tension, etc.) can be collected in real time, and the feeding speed can be adjusted in time according to the sensing data, so as to ensure that the feeding process is smooth and to reduce friction or impact, thereby ensuring the smooth operation of the feeding mechanism.

In some embodiments, the feeding mechanism 2 further includes an actuator (not shown in the figure). The processor is also configured to generate a control instruction to control the actuator to adjust the feeding speed based on the sensing data.

The actuator is configured to perform an operation based on the control instruction. In some embodiments, the actuator may be connected in communication with the processor. The actuator may include one of a feeding cylinder 231, a servo motor, or the like.

The control instruction refers to an instruction configured to control the actuator to adjust the feeding speed. For example, the control instruction may include decreasing the feeding speed by a preset rate of decrease or increasing the feeding speed by a preset rate of increase.

In some embodiments, the position sensor detects in real time the position of the pin tape relative to the guide groove 26 (i.e., the pin tape position described above), and the tension sensor detects in real time the pin tape tension. In response to a difference between the pin tape position and a preset position being greater than a first range and/or a difference between the pin tape tension and a preset tension being greater than a second range, the processor may automatically generate the control instruction through a preset algorithm (e.g., PID algorithm, etc.) based on the difference between the pin tape position and the preset position and/or the pin tape tension and the preset tension, and send the control instruction to the actuator. The actuator dynamically adjusts the feeding speed in response to receiving the control instruction.

The preset rate of decrease, the preset rate of increase, the preset position, the first range, the preset tension, and the second range may be set by the person skilled in the art based on experience, wherein the first range and the second range include positive and negative numbers. It will be appreciated that the difference between the pin tape position and the preset position, and/or the difference between the pin tape tension and the preset tension may be positive or negative numbers. When the difference between the pin tape position and the preset position, and/or the difference between the pin tape tension and the preset tension is a positive number, the corresponding control instruction may be to reduce the feeding speed by the preset rate of decrease. When the difference between the pin tape position and the preset position, and/or the difference between the pin tape tension and the preset tension is a negative number, the corresponding control instruction can be to speed up the feeding speed with a preset rate of increase.

In some embodiments of the present disclosure, the processor may, based on the position and tension of the pin tape detected by the sensor in real time, timely issue a control signal to control the actuator to adjust the feeding speed, which can effectively ensure that the feeding process is carried out smoothly and reduce friction and impact.

In some embodiments, the actuator includes a servo motor. The processor is further configured to adjust a sampling frequency of the sensor based on a type of the servo motor.

In some embodiments, the servo motor may replace the feeding cylinder 231 to perform high-precision control. The Type of the servo motor includes, but is not limited to, a DC servo motor, a linear servo motor, or the like. In some embodiments, the servo motor is of different types, and the servo motor is controlled at a different frequency (i.e., with a different control accuracy). The control frequency refers to a count of times the servo motor adjusts the feeding speed per unit time.

The sampling frequency refers to a count of times the sensor collects sensing data per unit time. The unit time may be set by a person skilled in the art based on experience, for example, 1 minute, 10 minutes, and so on.

In some embodiments, the processor may determine, based on the type of the servo motor, the control frequency of the servo motor; and determine, based on the control frequency of the servo motor and by querying a first preset table, a reference sampling frequency corresponding to a reference control frequency of the servo motor that is less than a frequency threshold, as the sampling frequency of the sensor.

The frequency threshold may be set by a person skilled in the art based on experience. The first preset table may be constructed experimentally, and the first preset table contains a plurality of reference control frequencies and a plurality of corresponding reference sampling frequencies.

In some embodiments of the present disclosure, by adjusting the sampling frequency of the sensor based on the type of the servo motor to make the sampling frequency of the sensor be able to match the control accuracy of the servo motor, on the one hand, it is possible to make the sensor provide sufficient feedback data so that the servo motor can be controlled with high precision; on the other hand, it is also possible to obtain the sensing data more scientifically and avoid wasting resources.

In order to facilitate the cutting of the insertion pin, in some embodiments, as shown in FIG. 4-FIG. 5, the cutting mechanism 4 includes the positioning frame 41, a cutting cylinder 42, a cutting assembly 46, a positioning cylinder 43, a positioning block 44, and a pin tape moving cylinder 45. The positioning frame 41 is fixed to one side of the fixed base plate 21, the cutting cylinder 42 is fixed to the positioning frame 41, the cutting assembly 46 is fixed to a movable end of the cutting cylinder 42, and a moving direction of the cutting assembly 46 and a moving direction of the pin tape are perpendicular to each other. The cutting cylinder 42 is configured to drive the cutting assembly 46 to move in a direction toward the pin tape, and the cutting assembly 46 is configured to cut the insertion pin from the pin tape. The positioning cylinder 43 is fixed to the positioning frame 41, and the positioning cylinder 43 is provided opposite to the cutting cylinder 42. The positioning block 44 is fixed to a movable end of the positioning cylinder 43, and the positioning block 44 is configured to abut against the side wall of the insertion pin. The positioning block 44 and the cutting assembly 46 are provided on both sides of the pin tape, the pin tape moving cylinder 45 is fixed to one side of the cutting cylinder 42, and the pin tape moving cylinder 45 is configured to drive the pin tape to move horizontally. The movable end of the pin tape moving cylinder 45 is fixed with a pin adapted to the positioning hole 5, and after the pin is inserted into the positioning hole 5, the pin tape moving cylinder 45 drives the pin tape to move horizontally. The pin tape moving cylinder 45 drives the pin tape to move horizontally until the insertion pin is located in the cutting station, and the positioning cylinder 43 drives the positioning block 44 to move in the direction toward the pin tape until the positioning block 44 moves to abut against the side wall of the insertion pin. The cutting cylinder 42 drives the cutting assembly 46 to move horizontally toward the insertion pin, and the two cutters 462 are able to cut the insertion pin off from the pin tape along the side walls of the insertion pin. The cutting cylinder 42 continues to drive the pushing block 461 in a direction toward the positioning block 44. As the insertion pin moves horizontally along an inner wall of the cutting assembly 46, the cutting assembly 46 is able to sand the side wall of the insertion pin, and when the insertion pin and a side wall of the pushing block 461 are pressed against each other, the positioning block 44 and the pushing block 461 cooperate with each other, which can squeeze and straighten the insertion pin. The cutters 462 may cause the insertion pin to bend and deform when the cutters 462 cut the insertion pin from the pin tape. As a result, when the insertion pin is pressed against the side wall of the pushing block 461, the positioning block 44 and the pushing block 461 cooperate with each other to be able to squeeze and straighten the insertion pin. As the insertion pin squeezes and contracts the limiting component 464 into a receiving groove 468, the limiting component 464 is configured to spray the flux against the side wall of the insertion pin, which aids in soldering a back end of the insertion pin.

The flux is used to remove oxides and dirt from the surface of the metal being soldered and to reduce the surface tension of the solder, thus improving the quality and reliability of the solder. For example, the flux may include a rosin-based flux, a water-soluble flux, or the like.

In some embodiments, the cutting assembly 46 includes a laser cutting device (not shown in the figures), wherein the laser cutting device is configured to achieve laser cutting between the insertion pin and the pin tape.

The laser cutting device refers to a device that utilizes a laser to cut the insertion pin. In some embodiments, the laser cutting device may be connected in communication with the processor. Understandably, compared to a mechanical cutter, the laser cutting can achieve non-contact cutting, to avoid extrusion at the location of the incision, and to reduce the problem of burrs and unevenness of the incision.

In some embodiments, the processor is further configured to adjust an output power of the laser cutting device based on the feeding speed and an insertion pin type.

In some embodiments, the insertion pin type may include a material type, a thickness type, a plating type, etc., of the insertion pin. For example, the insertion pin may be made by one of pure copper, tin-plated copper, copper-zinc alloy, or the like of varying thickness. The insertion pin type may be set in advance by a person skilled in the art.

In some embodiments, the processor may input the feeding speed and the insertion pin type into a power prediction model and obtain the output power from the power prediction model.

In some embodiments, the power prediction model may be a machine learning model. For example, the power prediction model may be a neural network (NN) model or any other customized model, etc.

In some embodiments, the power prediction model may be obtained by training based on a plurality of first training samples with first labels. For example, the plurality of first training samples with the first labels may be input into an initial power prediction model, a loss function is constructed from the first label and the output of the initial power prediction model, and based on the loss function, parameters of the initial power prediction model may be iteratively updated through a gradient descent or other methods. The model training is completed when a preset condition is satisfied, and the trained power prediction model is obtained. The preset condition may be the loss function converging, a count of iterations reaching a threshold, and so on.

In some embodiments, the first training sample may include an actual feeding speed and an actual insertion pin type corresponding to a preferred cut in historical data, and the first label is an actual output power employed by the laser cutting device during that preferred cut. The preferred cut refers to a cut in which the cut is flat and the area of discoloration, oxidation, melting, or deformation of the insertion pin is less than an area threshold. The area threshold may be set by a person skilled in the art based on experience.

In some embodiments of the present disclosure, by adjusting the output power of the laser cutting device based on the feeding speed and the insertion pin type, it is possible to reduce the possibility of overheating and deformation of the insertion pin due to the output power being too high or reduce the possibility of the insertion pin not being cut due to the output power being too low, thereby ensuring the cutting effect and the cutting quality.

In some embodiments, the cutting mechanism 4 further includes a visual identification device (not shown in the figures). The visual identification device is configured to recognize the actual position of the insertion pin at the cutting station. The processor is also configured to adjust the cutting position of the cutting assembly 46 based on the actual position of the insertion pin at the cutting station.

The visual identification device is configured to capture a pin tape image and perform recognition processing on the pin tape image. For example, the visual identification device may be integrated with an industrial camera, a camera, and an image processing unit. In some embodiments, the visual identification device may be provided above the cutting station. The visual identification device may collect a pin tape image using the camera or the like, and perform image recognition on the pin tape image by the image processing unit, to obtain the actual position of the insertion pin at the cutting station, a distribution of the insertion pin to be cut, or the like. In some embodiments, the visual identification device may be connected to the processor. See the related description below for more descriptions of the distribution of the insertion pin to be cut.

In some embodiments, the processor may adjust, based on the actual position of the insertion pin at the cutting station, the cutting position of the cutting assembly 46 to the actual position of the insertion pin at the cutting station. More on how to adjust the cutting position of the cutting assembly 60 may be found in FIG. 4-FIG. 5 and their related descriptions.

In some embodiments of the present disclosure, by providing a visual identification device to recognize the actual position of the insertion pin at the cutting station, and adjusting, based on the actual position of the insertion pin at the cutting station, a position of the cutting assembly so that the cutting position is accurately aligned with the insertion pin, it is possible to improve the accuracy of the cutting.

In order to facilitate sanding for deburring, in some embodiments, as shown in FIG. 5-FIG. 6, the cutting assembly 46 includes the pushing block 461, the two cutters 462, two sanding components 463, and the limiting component 464. The pushing block 461 is fixed to the movable end of the cutting cylinder 42. The two cutters 462 are symmetrically fixed to an end of the pushing block 461, and a distance between the two cutters 462 is not less than a width of the insertion pin. The two cutters 462 are respectively provided with edges near an end portion of the insertion pin, and the edges are capable of cutting the insertion pin off from the pin tape during movement toward the pin tape. One end of the sanding component 463 is fixed to an inner wall of the cutter 462, and the two sanding components 463 are configured to sand side walls of the insertion pin on both sides. The limiting component 464 is slidably disposed between the two cutters 462, wherein after the insertion pin is moved to the cutting station, the positioning block 44 moves toward the insertion pin to abut against the insertion pin. The cutting cylinder 42 drives the pushing block 461 to move toward the other side of the insertion pin, and the pushing block 461 drives the cutters 462 to move toward the pin tape to bring the limiting component 464 against the other side of the insertion pin. At this time, the limiting component 464 and the positioning block 44 abut against both sides of the insertion pin, respectively. The cutters 462 continue to move toward the insertion pin to cut connecting tapes on both sides of the insertion pin. As the insertion pin moves toward the pushing block 461, the insertion pin is configured to eject the limiting component 464 to achieve a synchronized contraction move toward the pushing block 461. The insertion pin moves horizontally toward the sanding component 463, wherein the sanding component 463 is configured to sand the burrs on the side walls of the insertion pin.

In some embodiments, the cutting assembly 46 further includes an automatic cleaning device (not shown in the figures), wherein the automatic cleaning device is configured to perform a cleaning operation to remove debris from the cutters 462 and the sanding components 463 based on a cleaning cycle.

The automatic cleaning device refers to a device configured to clean the debris generated during the process of cutting the insertion pin. In some embodiments, the automatic cleaning device may include a microfan, a flexible brush, a chip collection box, or the like. The microfan is configured to blow away the debris adhering to a surface of the cutter 462 and the sanding component 463. In some embodiments, the microfan may be mounted above the pushing block 461. The flexible brush is configured to conjunct with the microfan to remove attached debris. In some embodiments, the flexible brush may be provided between an end of the pushing block 461 and the limiting component 464. The chip collection box is configured to collect the debris. In some embodiments, the chip collection box may be provided in a cavity location below the cutter 462. In some embodiments, the automatic cleaning device may be in communication with the processor.

The cleaning cycle refers to a time interval between the last execution of the cleaning operation and the next execution of the cleaning operation. In some embodiments, the cleaning cycle may be determined by a person skilled in the art based on experience.

In some embodiments, the processor is further configured to determine the cleaning cycle of the automatic cleaning device based on the feeding speed and a cutting accuracy of the laser cutting device. More on the feeding speed may be found in the relevant descriptions above (e.g., FIG. 2-FIG. 4).

The cutting accuracy refers to the precision with which the laser cutting device cuts the insertion pin. In some embodiments, the cutting accuracy may be obtained from a factory report of the laser cutting device.

In some embodiments, the processor may calculate, based on the feeding speed and the cutting accuracy of the laser cutting device, the cleaning cycle of the automatic cleaning device by means of a preset formula. For example, the preset formula may include:

$$T = k_1 \times V + k_2 \times \delta$$

where T denotes the cleaning cycle of the automatic cleaning device; V denotes the feeding speed; $\delta$ denotes the cutting accuracy of the laser cutting device; $k_1$ and $k_2$ denote a feeding speed coefficient and a cutting accuracy coefficient, respectively, and $k_1$ and $k_2$ may be set by a person skilled in the art based on experience.

According to some embodiments of the present disclosure, the feeding speed and the cutting accuracy of the laser cutting device can be affected by the debris generated during the process of cutting the insertion pin. Therefore, based on the feeding speed and the cutting accuracy of the laser cutting device, a more appropriate cleaning cycle can be determined, which can better clean the cutter and the sanding component to ensure the cutting accuracy.

The cleaning operation refers to an operation to clean up the debris generated during the process of cutting the insertion pin. In some embodiments, each round of the cleaning operation may include: the microfan emits a stream of air to blow away the debris adhering to the surface of the cutter 462 and the sanding component 463; the flexible brush cooperates with the microfan to remove adhering debris; and the debris cleaned by the microfan and the flexible brush may be collected in the chip collection box.

According to some embodiments of the present disclosure, by providing the automatic cleaning device, the debris generated during the process of cutting the insertion pin can be cleaned up, so as to avoid deviation of cutting due to the accumulation of the debris, and to further ensure the cutting effect and the quality of cutting.

In some embodiments, the processor may determine a time to perform the cleaning operation in a plurality of ways. For example, the cleaning operation is performed when the cleaning cycle is reached.

In some embodiments, the processor is further configured to in response to a debris buildup volume being greater than a preset buildup threshold, generate the cleaning instruction to control the automatic cleaning device to perform the cleaning operation. For more on the debris buildup volume, please see the related description below.

The preset buildup threshold refers to a maximum amount of debris that can be accommodated within the cutting assembly 46. In some embodiments, the preset buildup threshold may be set by one of skill in the art based on experience.

The cleaning instruction refers to an instruction that controls the automatic cleaning device to perform the cleaning operation. In some embodiments, in response to the debris buildup volume being greater than the preset buildup threshold, the processor may automatically generate, based on a preset program, the cleaning instruction to control the automatic cleaning device to perform the cleaning operation. The preset program may be set in advance by a person skilled in the art.

According to some embodiments of the present disclosure, when the debris buildup volume is greater than the preset buildup threshold, performing the cleaning operation can avoid affecting the effect and the quality of the cutting of the cutting assembly 46 due to excessive buildup of debris caused by an unreasonable cleaning cycle.

In some embodiments, the processor is further configured to determine the debris buildup volume based on the distribution of the insertion pins to be cut, and determine a cleaning intensity of the automatic cleaning device based on the debris buildup volume.

The distribution of the insertion pins to be cut refers to information about the distribution of the insertion pins on the pin tape entering the cutting station during a preset time period. For example, the distribution of the insertion pins to be cut may include the type of insertion pin to be cut, a count of the insertion pins, and a distance of adjacent insertion pins. In some embodiments, the distribution of the insertion pins to be cut may be obtained by the visual identification device. More about the visual identification device may be found in the relevant descriptions above (e.g., FIG. 4-FIG. 5).

The debris buildup volume refers to an accumulation volume or an amount of debris. In some embodiments, the processor may determine the debris buildup volume based on the distribution of the insertion pins to be cut and the pin tape image by a buildup volume prediction model. The preset time period may be set by a person skilled in the art based on experience.

In some embodiments, the buildup volume prediction model may be a machine learning model, such as an NN model or any other customized model.

In some embodiments, the buildup volume prediction model may be obtained by training a plurality of second training samples with second labels. In this regard, the training process of the buildup volume prediction model is similar to the training process of the power prediction model, and is not described herein.

In some embodiments, the second training sample may include a distribution of insertion pins that have been cut and a corresponding pin tape image in historical data, and the second label may be an actual debris buildup volume corresponding to the second training sample.

The cleaning intensity refers to the strength or vigor with which debris is cleaned. For example, the cleaning intensity may include the power of the microfan, the force of the flexible brush, etc.

In some embodiments, the processor may determine, based on the debris buildup volume, the cleaning intensity of the automatic cleaning device in a plurality of ways. For example, the processor may determine the cleaning intensity of the automatic cleaning device by using the following formula (1).

$$S = k_0 \times V \quad (1)$$

where S is the cleaning intensity of the automatic cleaning device; $k_0$ is a buildup volume coefficient, wherein $k_0$ may be set by a person skilled in the art based on experience; and V is the debris buildup volume.

According to some embodiments of the present disclosure, based on the distribution of the insertion pins to be cut, predicting the debris buildup volume by a trained buildup volume prediction model, and thus determining the cleaning intensity of the automatic cleaning device, can ensure that the cleaning intensity is more reasonable, so as to more thoroughly clean the debris.

In order to facilitate sanding and limit the insertion pin, in some embodiments, as shown in FIG. 5-FIG. 6, the sanding component 463 is in a form of a circular arc, and a sliding column 465 is provided between the other end of the sanding component 463 and the inner wall of the cutter 462. A distance between two sanding components 463 is less than a width of the insertion pin, wherein the pushing block 461 continues to move toward the positioning block 44, and the insertion pin squeezes the sanding components 463 to deform the other ends of the sanding components 463 toward side walls of the cutters 462. As the side wall of the insertion pin is deformed by squeezing the sanding components 463, the sanding components 463 sand the burrs on the side wall of the insertion pin, and the sliding column 465 is contracted into the side walls of the cutters 462. A reservoir capsule 470 is provided in the pushing block 461 and configured to store the flux, and the sliding column 465 is configured to abut against an outer wall of the reservoir capsule 470. In the process of moving the other end of the sanding component 463 toward the inner wall of the cutter 462, the sliding column 465 is configured to squeeze the reservoir capsule 470 to spray the flux inside the reservoir capsule 470 toward the sponge block located in the receiving groove 468. In the process of contracting the limiting component 464 into the receiving groove 468, the limiting component 464 squeezes the sponge block to enable the flux within the sponge block to pass through a positioning plate 467 and be ejected toward the side wall of the insertion pin.

In order to facilitate cleaning and jiggling the burrs, in some embodiments, as shown in FIGS. 5-FIG. 6, a collection plate 47 is provided at a bottom between the two cutters 462, and the collection plate 47 is configured to collect burr debris falling from the outer wall of the insertion pin. The limiting component 464 includes a limiting block 466, a compression spring, and the positioning plate 467. The side wall of the pushing block 461 is provided with the receiving groove 468. The limiting block 466 is configured to contract into the receiving groove 468. One end of the compression spring is fixed to a side wall of the receiving groove 468, and the other end of the compression spring is fixed to a side wall of the positioning plate 467. The limiting block 466 is vertically adjustably provided on an outer wall of the positioning plate 467, and the limiting block 466 is configured to engage the insertion pin. The limiting block 466 is in the shape of a "T," and the width of the vertical segment of the limiting block 466 is less than a distance between the two sanding components 463. A lower end of a horizontal segment of the limiting block 466 abuts against a bottom wall of the collection plate 47 between the two cutters 462. As the pushing block 461 drives the two cutters 462 to move toward the positioning block 44 to the point where the insertion pin abuts against the two sanding components 463, the sanding component 463 is configured to sand the burrs on the outer wall of the insertion pin, and the collection plate 47 is configured to collect the burr debris falling from the insertion pin. When the side wall of the insertion pin abuts against the side wall of the pushing block 461, the insertion pin is configured to push the limiting block 466 and the positioning plate 467 to contract into the receiving groove 468, and at this time, the pushing block 461 and the positioning block 44 are able to squeeze the insertion pin straight.

In some embodiments, the sponge block is fixed to an inner wall of the receiving groove 468, the sponge block is connected to the reservoir capsule 470, a plurality of through-holes are provided on the positioning plate 467, and a spring tube 469 is slidably disposed in each of the plurality of through-holes. An interior of the spring tube 469 is hollow, the side wall of the limiting block 466 is provided with an oil injection hole adapted to the spring tube 469, one end of the spring tube 469 is slidably provided in the side wall of the limiting block 466, and the other end of the spring tube 469 is able to penetrate the positioning plate 467 and abut against the sponge block. The side of the limiting block 466 near the spring tube 469 is provided with a vertical sliding groove, and the spring tube 469 is slidably disposed within the vertical sliding groove, i.e., the limiting block 466 is capable of sliding upward and downward vertically with respect to the spring tube 469 and the positioning plate 467. When the insertion pin is not inserted between the two cutters 462, the other end of the spring tube 469 does not protrude from the side wall of the positioning plate 467. When the insertion pin squeezes the limiting block 466, the limiting block 466 is configured to squeeze the spring tube 469 so that the spring tube 469 protrudes out of the positioning block 44, and an end of the spring tube 469 is inserted into the sponge block to allow the flux to flow into the spring tube 469, and to be ejected toward the side wall of the insertion pin through the injection holes. When the limiting block 466 is retracted into the receiving groove 468, the flux on the sponge block is configured to be ejected through the spring tube 469 toward the side wall of the insertion pin. After the insertion pin is extruded and pressed straight, the pushing block 461 is moved in a direction away from the positioning block 44 to the point that the insertion pin is contact with the end walls of the two sanding components 463, at which point the positioning plate 467 is pushed by the compression spring so that the limiting block 466 remains against the other side of the insertion pin. When the gripper finger 334 moves downward, the gripper finger 334 is configured to squeeze the limiting block 466 so that the limiting block 466 can push the spring tube 469 to move in a direction toward the positioning plate 467. During the process in which the gripper finger 334 clamps the insertion pin and drives the insertion pin upwardly, the insertion pin is configured to drive the limiting block 466 upwardly with respect to the positioning plate 467, and finally the insertion pin is detached from the limiting block 466, and the insertion pin is able to drive the limiting block 466 to shake relative to the positioning plate 467, which may shake off the burr debris adhering to a lower end of the limiting block 466. After the insertion pin is removed by the gripper finger 334, the compression spring is configured to push the positioning plate 467 and the limiting block 466 to slide outward synchronously, and the lower end of the limiting block 466 is able to slide outward along the collection plate 47 to clean the burr debris collected within the collection plate 47. When the pickup mechanism 3 clamps the insertion pin, the insertion pin is configured to drive the limiting block 466 simultaneously upwards during the upward movement of the insertion pin to enable the limiting block 466 to vibrate with respect to the positioning plate 467.

In order to facilitate the removal of the insertion pin, in some embodiments, as shown in FIG. 7, the pickup mechanism 3 includes a rotating motor 31, a gripper turntable 32, the pickup pin gripper 33, and the vertical module 34. The gripper turntable 32 is fixed to a movable end of the rotating motor 31, and the rotating motor 31 is fixed to a side of the positioning frame 41. The rotating motor 31 is configured to drive the gripper turntable 32 to rotate circumferentially, to enable a plurality of pickup pin grippers 33 on the gripper turntable 32 to be moved in sequence to the top of the cutting station. The plurality of pickup pin grippers 33 are circumferentially disposed around the gripper turntable 32, and the plurality of pickup pin grippers 33 are configured to pick up the insertion pins. A positioning bracket is fixed above the pickup mechanism 3, and an upper end of the vertical module 34 is fixed to the positioning bracket. The vertical module 34 is fixed above the cutting assembly 46, and the vertical module 34 is configured to drive the plurality of pickup pin grippers 33 to move downwardly. When the plurality of pickup pin grippers 33 are circumferentially rotated below the vertical module 34, a movable end of the vertical module 34 moves downward to push the plurality of pickup pin grippers 33 toward the insertion pins to pick up the insertion pins.

In some embodiments, as shown in FIG. 9, the vertical module 34 includes a fixed rod, a servo motor 341, a linear module 342, and a pressing block 343. The fixed rod is fixed vertically on the positioning bracket, the servo motor 341 is fixed to a side wall of the fixed rod, the linear module 342 is fixed to the side wall of the fixing rod, the pressing block 343 is vertically adjustably provided on the linear module 342, and the pressing block 343 is coupled with the servo motor 341. The servo motor 341 is configured to drive the pressing block 343 to move vertically up and down along the linear module 342.

In some embodiments, as shown in FIG. 8-FIG. 9, the pickup pin gripper 33 includes a pin pickup frame 331, a gripper riser 332, a gripper cylinder 333, the gripper fingers 334, and a reset spring 335. The pin pickup frame 331 is fixed to the gripper turntable 32. The gripper riser 332 is vertically adjustably provided on a side wall of the pin pickup frame 331, the gripper cylinder 333 is fixed to a lower end of the gripper riser 332, and two of the gripper fingers 334 are symmetrically fixed at a movable end of the gripper cylinder 333. One end of the reset spring 335 is fixed on the pin pickup frame 331, and the other end of the reset spring 335 is fixed on the gripper riser 332. After the gripper turntable 32 drives the gripper finger 334 to move above the cutting station, the servo motor 341 drives the pressing block 343 to move downward, and the pressing block 343 abuts against the gripper finger 332. The pressing block 343 is configured to push the gripper finger 332 downward so that the gripper finger 334 is able to pick up the insertion pin. After the gripper fingers 334 picks up the insertion pin, the pressing block 343 slides upward to reset, and the reset spring 335 is able to pull the gripper riser 332 to slide upward.

Some embodiments of the present disclosure also provide an operating method of a tape-guided pin insertion feeding mechanism (hereinafter referred to as an operating method), which is performed by the aforementioned tape-guided pin insertion feeding mechanism, wherein the operating method includes the following steps.

The pin tape is wound on the pin tape material tray 1. The pin tape passes through the plurality of guide wheels 25 and the pin tape guide plate 22 in turn, and then extends toward the cutting mechanism 4. The movable end of the horizontal prismatic joint 23 moves horizontally to drive the pin tape to move uniformly towards the cutting station.

After the insertion pin is moved to the cutting station, the positioning cylinder 43 is configured to drive the positioning block 44 to move toward the insertion pin until the positioning block abuts against one side wall of the insertion pin. The cutting cylinder 42 is configured to drive the cutting assembly 46 to move toward the other side of the insertion pin.

The limiting component 464 first abuts against the other side wall of the insertion pin, and during a process of the cutters 462 continuing to move toward the insertion pin, the cutters 462 are able to cut off the connecting tapes on both sides of the insertion pin.

As the cutting assembly 46 continues to move in a direction towards the positioning block 44, the insertion pin is capable of moving inwardly along an inner wall of the two cutters 462 to bring the side walls of the insertion pin against the sanding components 463. The insertion pin is configured to push against the sanding component 463 to deform, and the sanding component 463 is configured to sand the burrs on the side walls of the insertion pin.

When the insertion pin abuts against the side wall of the pushing block 461, the limiting component 464 is capable of spraying the flux against the insertion pin.

The basic concepts have been described above, and it is apparent to those skilled in the art that the foregoing detailed disclosure serves only as an example and does not constitute a limitation of the present disclosure. While not expressly stated herein, a person skilled in the art may make a plurality of modifications, improvements, and amendments to this disclosure. Those types of modifications, improvements, and amendments are suggested in this disclosure, so those types of modifications, improvements, and amendments remain within the spirit and scope of the exemplary embodiments of this disclosure.

What is claimed is:

1. A tape-guided pin insertion feeding mechanism comprising: a pin tape material tray, a feeding mechanism, a pickup mechanism, and a cutting mechanism, wherein
    the pin tape material tray is rotatably disposed on one side of the feeding mechanism, the pin tape material tray is configured to store a pin tape;
    the feeding mechanism is fixed to one side of the cutting mechanism, wherein the feeding mechanism is configured to drive the pin tape to move horizontally towards the cutting mechanism to feed material;
    the pickup mechanism is rotatably disposed on one side of the cutting mechanism;
    the cutting mechanism is configured to cut a single insertion pin from the pin tape, wherein
    a movable end of the cutting mechanism is configured to move horizontally toward the pin tape to disengage the insertion pin from the pin tape when the pin tape is located at a cutting position of the cutting mechanism;
    the movable end of the cutting mechanism is further configured to sand an outer wall of the insertion pin and spray flux to a side wall of the insertion pin during a movement of the insertion pin within the movable end of the cutting mechanism;
    a movable end of the pickup mechanism moves downwardly to pick up the insertion pin disposed within the movable end of the cutting mechanism; and
    the feeding mechanism includes a fixed base plate, a pin tape guide plate, a horizontal prismatic joint, two sensors, and a plurality of guide wheels, wherein the fixed base plate is horizontally disposed, the pin tape guide plate is vertically fixed to the fixed base plate, and a side wall of the pin tape guide plate is provided with a guide groove for horizontal movement of the pin tape;
    the horizontal prismatic joint is fixed to the fixed base plate and a movable end of the horizontal prismatic joint is capable of being moved horizontally with respect to the pin tape guide plate;
    the plurality of guide wheels are rotatably disposed on the fixed base plate, and the pin tape is configured to be inserted into the guide groove after passing from the pin tape material tray through the plurality of guide wheels;
    the two sensors are respectively fixed on both sides of the pin tape guide plate, wherein
    the movable end of the horizontal prismatic joint is configured to drive the pin tape to move horizontally in a direction toward the cutting mechanism; and
    the horizontal prismatic joint includes a feeding cylinder, a horizontal slide plate, a fixed cylinder, and two positioning pins, wherein the feeding cylinder is fixed to the fixed base plate, and the feeding cylinder is parallel to the pin tape guide plate;
    the horizontal slide plate is fixed to a movable end of the feeding cylinder;
    the fixed cylinder is fixed to the horizontal slide plate, the fixed cylinder and the pin tape guide plate are perpendicular to each other;
    the two positioning pins are symmetrically fixed to a movable end of the fixed cylinder, and the two positioning pins are configured to be inserted into positioning holes of the pin tape; and
    the cutting mechanism includes a positioning frame, a cutting cylinder, a cutting assembly, a positioning cylinder, a positioning block, and a pin tape moving cylinder, wherein the positioning frame is fixed to one side of the fixed base plate, the cutting cylinder is fixed to the positioning frame, the cutting assembly is fixed to a movable end of the cutting cylinder, and a moving direction of the cutting assembly and a moving direction of the pin tape are perpendicular to each other;
    the positioning cylinder is fixed to the positioning frame, and the positioning cylinder is provided opposite to the cutting cylinder;
    the positioning block is fixed to a movable end of the positioning cylinder, and the positioning block is configured to abut against the side wall of the insertion pin;
    the pin tape moving cylinder is fixed to one side of the cutting cylinder, the pin tape moving cylinder is configured to drive the pin tape to move horizontally; wherein
    the pin tape moving cylinder is configured to drive the pin tape to move horizontally to locate the insertion pin in the cutting station, and the positioning block is configured to move toward the insertion pin for abutting against the side wall of the insertion pin;
    the cutting assembly is configured to cut the insertion pin off from the pin tape during a horizontal movement of the cutting assembly towards the insertion pin;
    the cutting assembly is further configured to sand the side wall of the insertion pin and spray the flux against the side wall of the insertion pin during a horizontal movement of the insertion pin along an inner wall of the cutting assembly; and
    the cutting assembly includes a pushing block, two cutters, two sanding components, and a limiting component, wherein the pushing block is fixed to the movable end of the cutting cylinder;

the two cutters are symmetrically fixed to an end of the pushing block, and a distance between the two cutters is not less than a width of the insertion pin;

one end of each of the two sanding components is fixed to an inner wall of a corresponding cutter, and the two sanding components are configured to sand the side wall of the insertion pin on both sides;

the limiting component is slidably disposed between the two cutters, wherein the positioning block is configured to move toward the insertion pin to abut against the insertion pin after the insertion pin is located at the cutting station;

the pushing block is configured to drive the two cutters to move toward the pin tape to bring the limiting component against the other side of the insertion pin;

the two cutters are configured to cut connecting tapes on both sides of the insertion pin during a movement of the two cutters toward to the insertion pin; and the insertion pin moves horizontally toward the two sanding components, wherein the two sanding components are configured to sand burrs on the side wall of the insertion pin; and each of the two sanding components is in a form of a circular arc, and a sliding column is provided between the other end of the sanding component and the inner wall of the corresponding cutter, wherein during a movement of the pushing block toward the positioning block, the insertion pin is configured to squeeze the two sanding components to deform the other end of the two sanding components toward side walls of the two cutters;

the sliding column is configured to retract into the side walls of the two cutters, to cause a reservoir capsule within the pushing block to eject the flux toward a side wall of the limiting component; and the limiting component includes a limiting block, a compression spring, and a positioning plate, wherein a side wall of the pushing block is provided with a receiving groove, the limiting block is configured to contract into the receiving groove;

one end of the compression spring is fixed to a side wall of the receiving groove, and the other end of the compression spring is fixed to a side wall of the positioning plate;

the limiting block is vertically adjustably provided on an outer wall of the positioning plate, the limiting block is configured to engage the insertion pin; and the limiting block is in form of a T-shaped and a width of a vertical segment of the limiting block is less than a distance between the two sanding components;

a lower end of a horizontal segment of the limiting block abuts against a bottom wall of a collection plate between the two cutters;

a sponge block is fixed on an inner wall of the receiving groove, the sponge block is connected to the reservoir capsule, the positioning plate is provided with a plurality of through-holes, each through-hole being slidably provided with a spring tube, one end of the spring tube being slidably provided on a side wall of the limiting block, wherein when the limiting block is retracted into the receiving groove, the sliding column is configured to spray the flux on the sponge block towards the side wall of the insertion pin through the spring tube;

when the pickup mechanism clamps the insertion pin, the insertion pin is configured to drive the limiting block synchronously upward during upward movement to enable the limiting block to vibrate with respect to the positioning plate.

2. The tape-guided pin insertion feeding mechanism of claim 1, wherein the pickup mechanism includes a rotating motor, a gripper turntable, a plurality of pickup pin grippers, and a vertical module, wherein the gripper turntable is fixed to a movable end of the rotating motor, and the rotating motor is fixed to a side of the positioning frame;

the plurality of pickup pin grippers are circumferentially disposed around the gripper turntable, the plurality of pickup pin grippers are configured to pick up the insertion pin;

the vertical module is fixed above the cutting assembly, and the vertical module is configured to drive the plurality of pickup pin grippers to move downwardly; wherein when the plurality of pickup pin grippers are circumferentially rotated below the vertical module, a movable end of the vertical module is configured to move downward to propel the plurality of pickup pin grippers toward the insertion pin to pick up the insertion pin.

3. The tape-guided pin insertion feeding mechanism of claim 2, wherein each of the plurality of pickup pin grippers include a pin pickup frame, a gripper riser, a gripper cylinder, gripper fingers, and a reset spring, wherein the pin pickup frame is fixed to the gripper turntable;

the gripper riser is vertically adjustably provided on a side wall of the pin pickup frame, the gripper cylinder is fixed at a lower end of the gripper riser, and two of the gripper fingers are symmetrically fixed at a movable end of the gripper cylinder; and one end of the reset spring is fixed on the pin pickup frame, and the other end of the reset spring is fixed on the gripper riser.

\* \* \* \* \*